US010314165B2

(12) United States Patent
Usami (10) Patent No.: US 10,314,165 B2
(45) Date of Patent: Jun. 4, 2019

(54) SEMICONDUCTOR DEVICE (71) Applicant: PS4 Luxco S.a.r.l., Luxembourg (LU)

(72) Inventor: Sensho Usami, Tokyo (JP)

(73) Assignee: LONGITUDE LICENSING LIMITED, Dublin (IE)

( * ) Notice: Subject to any disclaimer, the term of this patent is extended or adjusted under 35 U.S.C. 154(b) by 32 days.

(21) Appl. No.: 14/779,961

(22) PCT Filed: Mar. 20, 2014

(86) PCT No.: PCT/JP2014/057671
§ 371 (c)(1),
(2) Date: Sep. 24, 2015

(87) PCT Pub. No.: WO2014/156921
PCT Pub. Date: Oct. 2, 2014

(65) Prior Publication Data
US 2016/0050748 A1 Feb. 18, 2016

(30) Foreign Application Priority Data
Mar. 26, 2013 (JP) .................................. 2013-063818

(51) Int. Cl.
*H05K 1/02* (2006.01)
*H01L 23/16* (2006.01)
(Continued)

(52) U.S. Cl.
CPC .......... *H05K 1/0271* (2013.01); *H01L 21/561* (2013.01); *H01L 23/16* (2013.01);
(Continued)

(58) Field of Classification Search
CPC ........ H01L 23/3128; H01L 25/0652–25/0657; H01L 24/16; H01L 24/29; H01L 24/32;
(Continued)

(56) References Cited

U.S. PATENT DOCUMENTS 7,859,119 B1* 12/2010 St. Amand .......... H01L 25/0657
257/685
8,710,677 B2* 4/2014 Lee ........................ H01L 24/49
257/685
(Continued)

FOREIGN PATENT DOCUMENTS

JP    2006216776    8/2006
JP    2008166477    7/2008

OTHER PUBLICATIONS

Application No. PCT/JP2014/057671, International Search Report, dated Jun. 10, 2014.

*Primary Examiner* — Tuan T Dinh
(74) *Attorney, Agent, or Firm* — Kunzler Bean & Adamson (57) ABSTRACT

One semiconductor device includes a wiring substrate, a first semiconductor chip that is mounted on one surface of the wiring substrate, a second semiconductor chip that is laminated on the first semiconductor chip so as to form exposed surfaces where the surface of the first semiconductor chip is partially exposed, silicon substrates that are mounted on the exposed surfaces and serve as warping control members, and an encapsulation body that is formed on the wiring substrate so as to cover the first semiconductor chip, the second semiconductor chip and the silicon substrates.

10 Claims, 10 Drawing Sheets

(51) Int. Cl.
  *H01L 23/31*    (2006.01)
  *H01L 21/56*    (2006.01)
  *H01L 23/00*    (2006.01)
  *H01L 25/065*   (2006.01)
  *H01L 25/00*    (2006.01)
  *H05K 1/18*     (2006.01)
  *H01L 25/18*    (2006.01)

(52) U.S. Cl.
  CPC .......... *H01L 23/3135* (2013.01); *H01L 24/97* (2013.01); *H01L 25/0657* (2013.01); *H01L 25/50* (2013.01); *H05K 1/181* (2013.01); *H01L 23/3128* (2013.01); *H01L 24/06* (2013.01); *H01L 24/29* (2013.01); *H01L 24/32* (2013.01); *H01L 24/45* (2013.01); *H01L 24/48* (2013.01); *H01L 24/49* (2013.01); *H01L 24/73* (2013.01); *H01L 24/85* (2013.01); *H01L 24/92* (2013.01); *H01L 25/18* (2013.01); *H01L 2224/04042* (2013.01); *H01L 2224/05554* (2013.01); *H01L 2224/06135* (2013.01); *H01L 2224/2919* (2013.01); *H01L 2224/32145* (2013.01); *H01L 2224/32225* (2013.01); *H01L 2224/45144* (2013.01); *H01L 2224/45147* (2013.01); *H01L 2224/48091* (2013.01); *H01L 2224/48227* (2013.01); *H01L 2224/49175* (2013.01); *H01L 2224/73265* (2013.01); *H01L 2224/8592* (2013.01); *H01L 2224/85207* (2013.01); *H01L 2224/92247* (2013.01); *H01L 2224/97* (2013.01); *H01L 2225/0651* (2013.01); *H01L 2225/06562* (2013.01); *H01L 2924/1434* (2013.01); *H01L 2924/15311* (2013.01); *H01L 2924/181* (2013.01); *H01L 2924/3511* (2013.01); *H05K 2201/10515* (2013.01); *H05K 2201/2009* (2013.01)

(58) Field of Classification Search
  CPC . H01L 2224/05553; H01L 2224/05624; H01L 2224/16145
  USPC .......... 361/770–790; 257/686, 723–730, 777
  See application file for complete search history.

(56) References Cited

U.S. PATENT DOCUMENTS

| | | | |
|---|---|---|---|
| 9,177,886 B2* | 11/2015 | Ko | H01L 25/105 |
| 9,455,235 B2* | 9/2016 | Kim | H01L 24/11 |
| 2003/0183917 A1* | 10/2003 | Tsai | H01L 23/3128 |
| | | | 257/686 |
| 2010/0109141 A1 | 5/2010 | Nishiyama et al. | |
| 2011/0079905 A1* | 4/2011 | Sanchez | H01L 24/06 |
| | | | 257/738 |

* cited by examiner

SEMICONDUCTOR DEVICE

TECHNICAL FIELD

The present invention relates to a semiconductor device.

BACKGROUND

In order to increase the density of semiconductor devices, a plurality of semiconductor chips are stacked one over another. Such a semiconductor device is sometimes known as an MCP (Multi Chip Package).

The structure of MCP-type semiconductor devices is normally one in which an upper-level semiconductor chip is cross-stacked relative to a lower-level semiconductor chip to allow for wire bonding.

For example, patent literature article 1 discloses an MCP semiconductor device in which a rectangular second semiconductor chip (upper-level semiconductor chip) is stacked on a rectangular first semiconductor chip (lower-level semiconductor chip) installed on a wiring substrate, in a state in which the second semiconductor chip is rotated through 90° relative to the first semiconductor chip (patent literature article 1).

PATENT LITERATURE

Patent literature article 1: Japanese Patent Kokai 2011-86943

SUMMARY OF THE INVENTION

Problems to be Resolved by the Invention

However, if the semiconductor chips are cross-stacked, as in patent literature article 1, the thickness of the sealing resin on the lower-level semiconductor chip is different from the thickness of the sealing resin on the upper-level semiconductor chip, and therefore the side of the lower-level semiconductor chip on which the short edge, having the greater thickness of sealing resin, is disposed warps to a greater extent than the side of the upper-level semiconductor chip on which the short edge is disposed, and this gives rise to a problem in that the semiconductor device becomes warped in the shape of a saddle.

If the semiconductor device becomes warped in the shape of a saddle in this way, then there is a risk that secondary mounting of the semiconductor device on a mother board, or secondary mounting of the semiconductor device on a lower package in a PoP (Package on Package) cannot be performed satisfactorily.

There is therefore a desire for a semiconductor device having a structure capable of suppressing warping even if semiconductor chips are stacked on one another.

Means of Overcoming the Problems

In a first aspect of the present invention, a semiconductor device comprises: a wiring substrate; a first semiconductor chip installed on one surface of the wiring substrate; a second semiconductor chip stacked on the first semiconductor chip in such a way that a portion of a surface of the first semiconductor chip is exposed; a warp regulating member installed on the exposed portion of the surface; and a sealing body formed on the wiring substrate in such a way as to cover the first semiconductor chip, the second semiconductor chip and the warp regulating member.

Advantages of the Invention

According to the present invention, it is possible to provide a semiconductor device having a structure capable of suppressing warping even if semiconductor chips are stacked on one another.

MODES OF EMBODYING THE INVENTION

Preferred modes of embodiment of the present invention will now be described in detail with reference to the drawings.

The general structure of the semiconductor device 200 according to the first embodiment of the present invention will first be described with reference to FIG. 1 to FIG. 3.

Here, a semiconductor memory in which a memory chip is installed is illustrated as the semiconductor device 200, by way of example.

Figure 1:
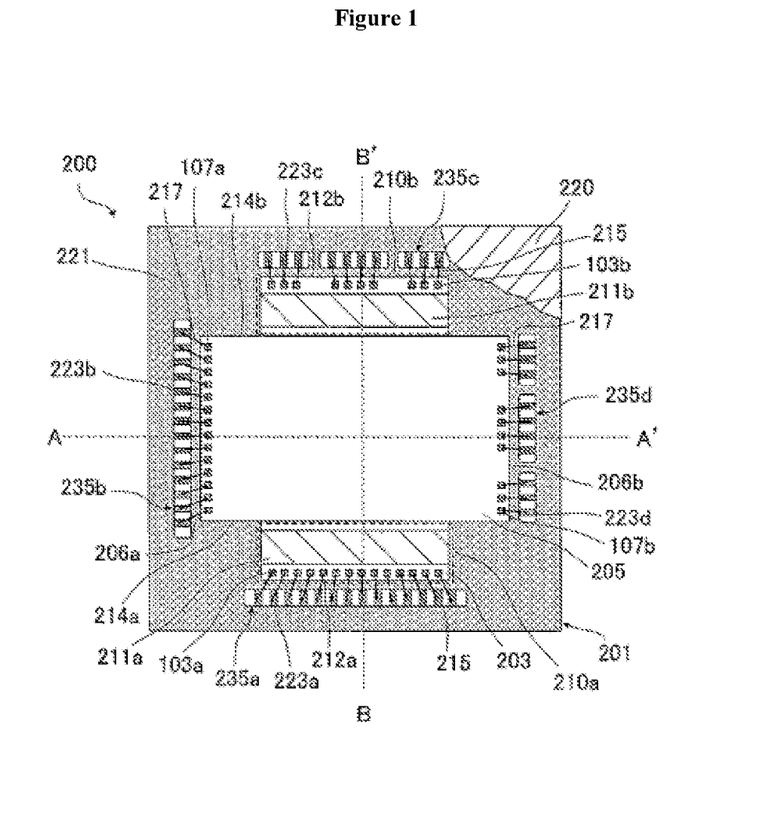
FIG. 1 is plan view illustrating a semiconductor device 200 according to a first mode of embodiment, in which only a portion of a sealing body 220 is depicted.
Figure 2:
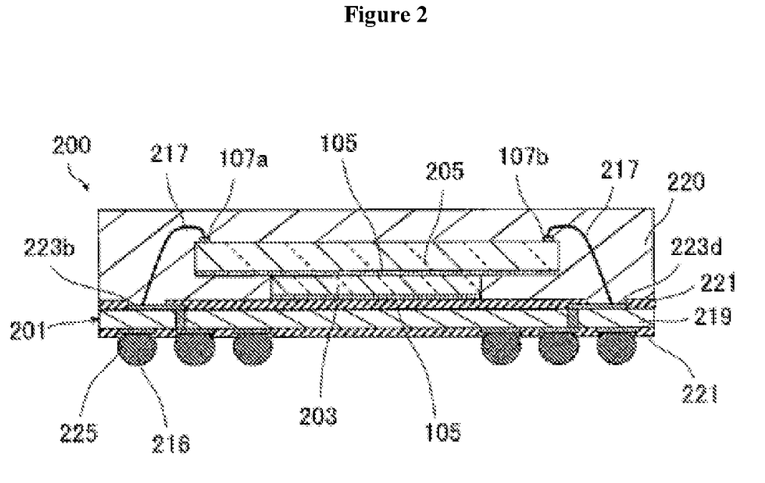
FIG. 2 is a cross-sectional view through A-A' in FIG. 1.
Figure 3:
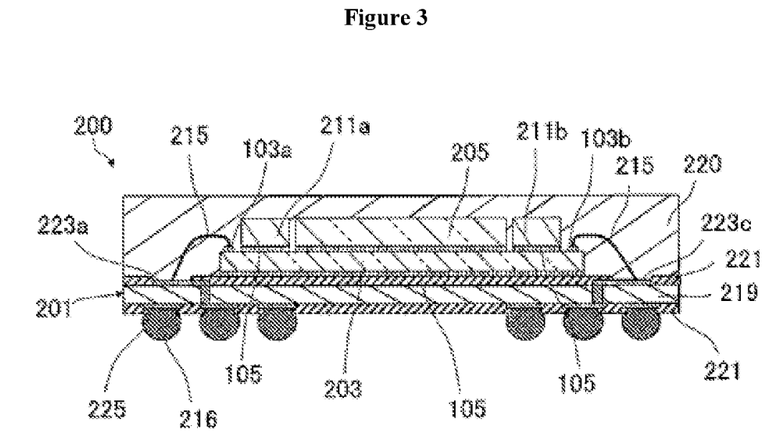
FIG. 3 is a cross-sectional view through B-B' in FIG. 1.

As illustrated in FIG. 1 to FIG. 3, the semiconductor device 200 comprises: a wiring substrate 201; a first semiconductor chip 203 installed on one surface of the wiring substrate 201; a second semiconductor chip 205 stacked on the first semiconductor chip 203 in such a way that portions of a surface of the first semiconductor chip 203 are exposed to form exposed surfaces 210a and 210b; silicon substrates 211a and 211b, serving as warp regulating members, installed on the exposed surfaces 210a and 210b; and a sealing body 220 formed on the wiring substrate 201 in such a way as to cover the first semiconductor chip 203, the second semiconductor chip 205 and the silicon substrates 211a and 211b.

More specifically, the semiconductor device 200 comprises: the wiring substrate 201 having on one surface a plurality of connection pads 223a, 223b, 223c and 223d; the first semiconductor chip 203 which is installed on one surface of the wiring substrate 201 and has electrode pads 103a and 103b; the second semiconductor chip 205 which is stacked on the first semiconductor chip 203 and has electrode pads 107a and 107b; the silicon substrates 211a and 211b which are installed on the exposed surfaces 210a and 210b; a plurality of wires 215 electrically connecting the plurality of connection pads 223a and 223c to the electrode pads 103a and 103b; a plurality of wires 217 electrically connecting the plurality of connection pads 223b and 223d to the electrode pads 107a and 107b; and the sealing body 220, formed on the one surface of the wiring substrate 201 in such a way as to cover the first semiconductor chip 203, the second semiconductor chip 205, the silicon substrates 211a and 211b, and the wires 215 and 217.

The semiconductor device 200 further comprises solder balls 216, serving as external terminals for connecting the semiconductor device 200 to an external device.

Details of the members which form the semiconductor device 200 according to the first mode of embodiment of the present invention will next be described with reference to FIG. 1 to FIG. 3.

The wiring substrate 201 comprises, for example, an insulating substrate 219 formed from a substantially quadrilateral plate-shaped glass epoxy or the like, wiring line layers (which are not shown in the drawings) which are pattern-formed on both surfaces of the insulating substrate 219, and insulating films 221 formed in such a way as to cover the wiring line layers. The plurality of connection pads 223a, 223b, 223c and 223d are connected to the wiring line layer on one surface side of the wiring substrate 201. Further, a plurality of land portions 225 are connected to the wiring line layer on the other surface side of the wiring substrate 201. As illustrated in FIG. 1, the plurality of connection pads 223a, 223b, 223c and 223d are respectively aligned in the vicinity of the peripheral edge portions of the four sides which form a quadrilateral constituting the one surface of the wiring substrate 201. Further, the plurality of land portions 225 are disposed in a lattice formation on the other surface of the wiring substrate 201.

Meanwhile, the plurality of connection pads 223a, 223b, 223c and 223d and the plurality of land portions 225 are connected to one another by means of wiring lines connected thereto and vias or the like which penetrate through the insulating substrate 219.

The wires 215 are connected to the connection pads 223a and 223c, the wires 217 are connected to the connection pads 223b and 223d, and the solder balls 216 are installed on the land portions 225.

The insulating film 221 is a solder resist (SR) or the like. The insulating film 221 is formed over the entire surface of the wiring substrate 201, excluding certain pre-determined regions. In other words, a portion of the insulating film 221 is removed in certain regions to provide one or more opening portions. For example, opening portions 235a, 235b, 235c and 235d are formed on one surface side of the wiring substrate 201. The opening portions 235a, 235b, 235c and 235d expose regions in which the plurality of connection pads 223a, 223b, 223c and 223d are formed, and regions in the vicinity thereof.

Opening portions exposing each of the plurality of land portions 225 are also formed on the other surface side of the wiring substrate 201.

The first semiconductor chip 203 is a substantially quadrilateral (here, rectangular) plate-shaped memory chip, and certain circuits and the electrode pads 103a and 103b are formed on one surface side thereof. The plurality of electrode pads 103a and 103b are aligned along the short edges 212a and 212b of the rectangle of the first semiconductor chip 203. The other surface of the first semiconductor chip 203 is adhesively secured by means of the adhesive member 105, such as a DAF (Die Attached Film), to a region of the wiring substrate 201 in which the insulating film 221 is formed.

In the same way as with the first semiconductor chip 203, the second semiconductor chip 205 is a substantially quadrilateral (rectangular) plate-shaped memory chip, and circuits similar to those on the first semiconductor chip 203, and the electrode pads 107a, 107b, are formed on one surface side thereof. The plurality of electrode pads 107a and 107b are formed aligned along the short edges 206a and 206b of the rectangle of the second semiconductor chip 205.

The second semiconductor chip 205 is installed by being stacked on the first semiconductor chip 203.

The second semiconductor chip 205 is formed in such a way that long edges 214a and 214b thereof face the short edges 212a and 212b of the first semiconductor chip 203, in such a way that the regions in which the electrode pads 103a and 103b of the first semiconductor chip 203 are formed are not covered. More specifically, the second semiconductor chip 205 is disposed (cross-stacked) in such a way that its planar arrangement intersects that of the first semiconductor chip 203, in a state in which the second semiconductor chip 205 is rotated through 90° relative to the first semiconductor chip 203.

As a result, the short edges 206a and 206b of the second semiconductor chip 205 overhang from the first semiconductor chip 203. In this way, portions of the upper surface of the first semiconductor chip 203 are exposed away from the second semiconductor chip 205, to form the exposed surfaces 210a and 210b.

The other surface of the second semiconductor chip 205 is adhesively secured to the first semiconductor chip 203 by means of the adhesive member 105 such as a DAF.

It should be noted that the second semiconductor chip 205 is preferably formed with a chip thickness that is greater than the chip thickness of the first semiconductor chip 203. This is to make it possible for the electrode pads 107a and 107b on the second semiconductor chip 205 to be connected satisfactorily using wires to the wiring substrate 201, without the occurrence of chip cracks, even if the second semiconductor chip 205 overhangs from the first semiconductor chip 203.

The silicon substrates 211a and 211b are members which prevent warping of the first semiconductor chip 203, and they are installed on the first semiconductor chip 203 with the interposition of the adhesive members 105.

The silicon substrates 211a and 211b are disposed on the exposed surfaces 210a and 210b, in regions thereof between the electrode pads 103a and 103b and the second semiconductor chip 205, in such a way that the electrode pads 103a and 103b on the first semiconductor chip 203 are exposed.

The silicon substrates 211a and 211b are preferably formed with substantially the same thickness as the second semiconductor chip 205, which is the upper-level memory chip.

In this way, by installing the silicon substrates 211a and 211b on the first semiconductor chip 203, which is the lower-level memory chip, exposed away from the second semiconductor chip 205, which is the upper-level memory chip, the thickness of the sealing body 220 formed on the exposed surfaces 210a and 210b of the first semiconductor chip 203, exposed away from the second semiconductor chip 205, can be made to be the same as or close to the thickness of the sealing body 220 formed on the second semiconductor chip 205.

In this way, warping of the first semiconductor chip 203 along the short edges 212a and 212b can be suppressed, and warping of the semiconductor device 200 can be reduced. Further, by reducing warping of the semiconductor device 200, secondary mounting of the semiconductor device 200 onto a motherboard or a lower package can be performed satisfactorily.

Meanwhile, the wires 215 and 217 are formed from an electrically conductive metal such as Au or Cu. The wires 215 and 217 electrically connect the plurality of electrode pads 103a, 103b, 107a and 107b to the corresponding connection pads 223a, 223b, 223c and 223d.

Here, the wires 215 connect the electrode pads 103a and 103b to the connection pads 223a and 223c, and the wires 217 connect the electrode pads 107a and 107b to the connection pads 223b and 223d.

The sealing body 220 is an insulating resin such as a thermosetting epoxy resin, and it seals the first semiconductor chip 203, the second semiconductor chip 205, the silicon substrates 211a and 211b and the wires 215 and 217 in such a way as to cover one surface side of the wiring substrate 201.

Details of the members which form the semiconductor device 200 have been provided hereinabove.

A method of manufacturing the semiconductor device 200 will next be described with reference to FIG. 4 and FIG. 5.

Figure 4:
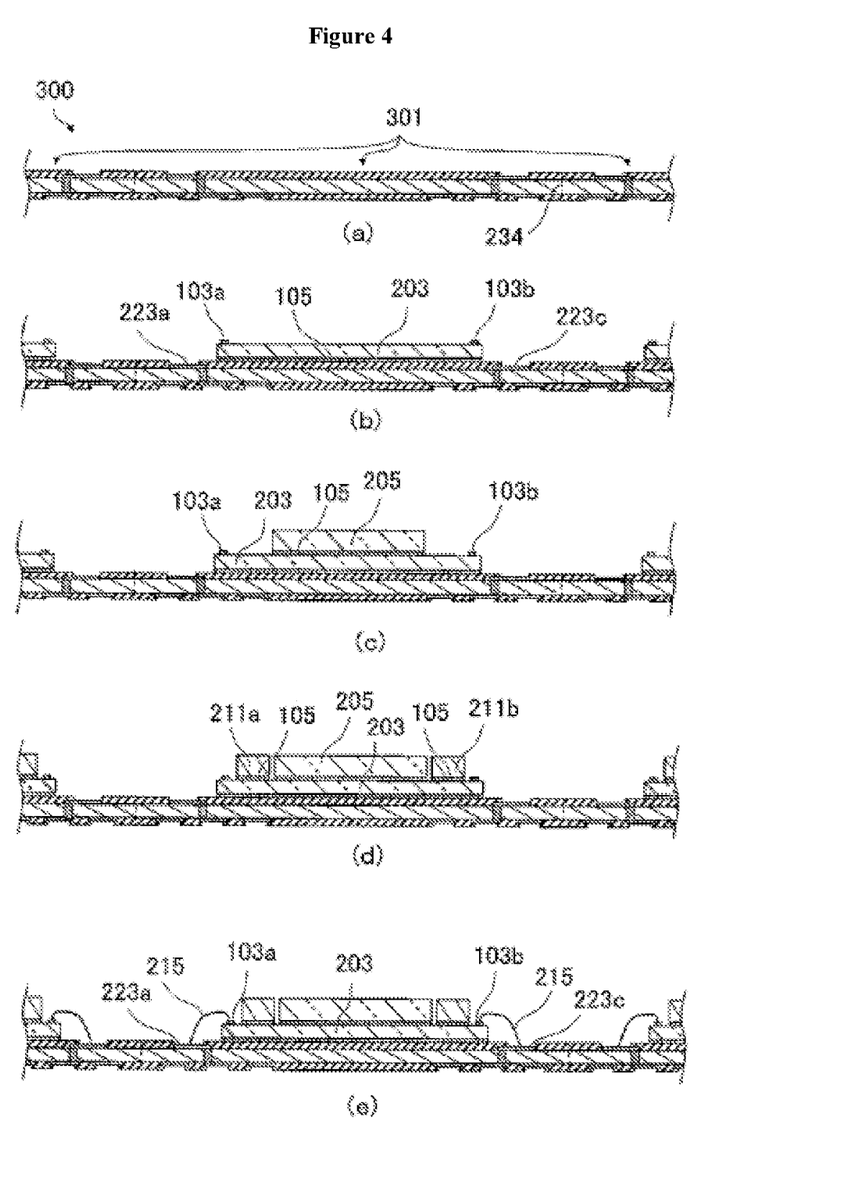
FIG. 4 is a drawing illustrating a procedure for manufacturing the semiconductor device 200.

First, a wiring mother substrate 300 as illustrated in FIG. 4 (a) is prepared. The wiring mother substrate 300 has a plurality of product-forming portions 301 disposed in a matrix formation, each product-forming portion 301 corresponding to a wiring substrate 201.

Next, as illustrated in FIG. 4 (b), the wiring mother substrate 300 is conveyed to a die bonding device, which is not shown in the drawings, and the first semiconductor chips 203 are installed on the product-forming portions 301 of the wiring mother substrate 300 using the die bonding device.

The first semiconductor chips 203 are installed in such a way that the short edges 212a and 212b on which the electrode pads 103a and 103b are provided face the connection pads 223a and 223c. The first semiconductor chips 203 are adhesively secured to the wiring mother substrate 300 by means of the adhesive members 105 such as a DAF or the like, provided on the other surface.

Next, as illustrated in FIG. 4 (c), the second semiconductor chips 205 are installed on the first semiconductor chips 203 using the die bonding device.

More specifically, the second semiconductor chips 205 are stacked in a state in which they are rotated through 90° relative to the first semiconductor chips 203, in such a way that the electrode pads 103a and 103b and the exposed surfaces 210a and 210b (see FIG. 1) are exposed.

By stacking the second semiconductor chips 205 in a state in which they are rotated through 90° relative to the first semiconductor chips 203, the plurality of electrode pads 103a and 103b formed along the short edges 212a and 212b of the first semiconductor chips 203 are exposed away from the second semiconductor chips 205.

Next, as illustrated in FIG. 4 (d), the silicon substrates 211a and 211b are installed on the exposed surfaces 210a and 210b of the first semiconductor chips 203.

The silicon substrates 211a and 211b are installed using the die bonding device or the like.

Next, as illustrated in FIG. 4 (e), the electrode pads 103a and 103b on the first semiconductor chips 203 are connected to the corresponding connection pads 223a and 223c by means of the wires 215, and the electrode pads 107a and 107b on the second semiconductor chips 205 are connected to the connection pads 223b and 223d by means of the wires 217 (see FIG. 1). A wire bonding device, which is not shown in the drawings, can be employed to form the connections using the wires 215 and 217. The connections are formed, for example, by means of ball bonding using an ultrasonic thermo-compression bonding method. More specifically, the distal ends of the wires 215, which have been melted to form balls, are bonded onto the electrode pads 103a and 103b using ultrasonic thermo-compression bonding, and the rear ends of the wires 215 are bonded onto the corresponding connection pads 223a and 223c using ultrasonic thermo-compression bonding in such a way that the wires 215 describe a certain loop shape.

Similarly, the distal ends of the wires 217, which have been melted to form balls, are bonded onto the electrode pads 107a and 107b using ultrasonic thermo-compression bonding, and the rear ends of the wires 217 are bonded onto the corresponding connection pads 223b and 223d using ultrasonic thermo-compression bonding in such a way that the wires 217 describe a certain loop shape.

Figure 5:
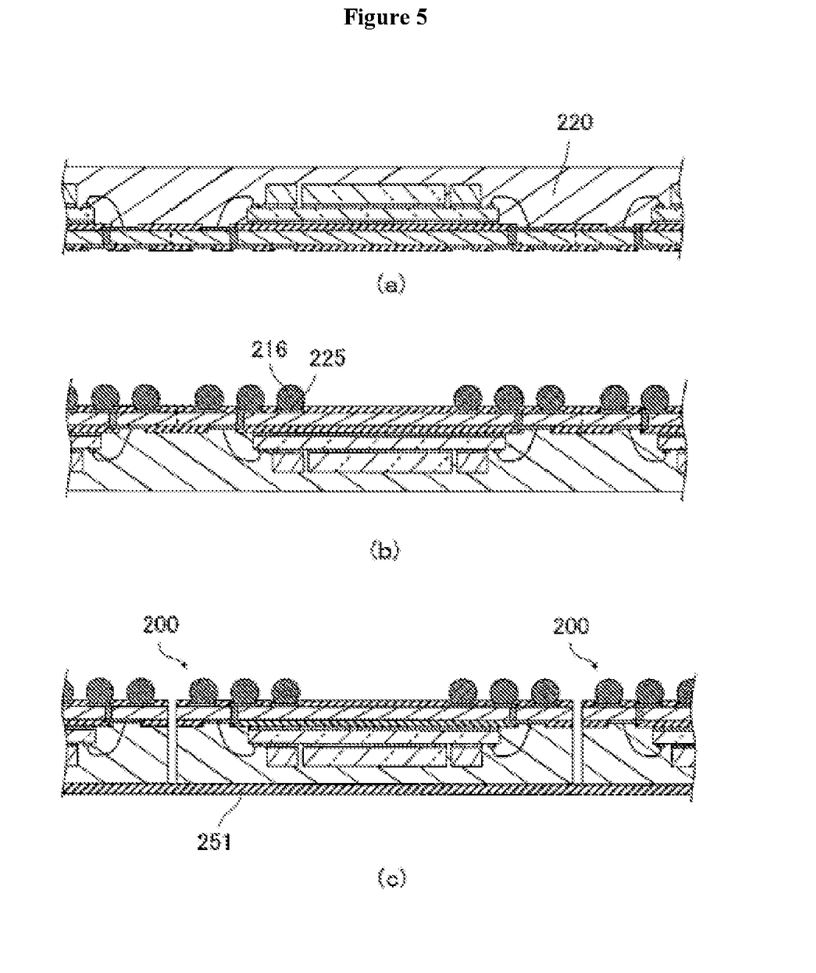
FIG. 5 is a drawing illustrating a procedure for manufacturing the semiconductor device 200.

Next, the sealing body 220 is formed on one surface side of the wiring mother substrate 300 by batch molding using a molding device, as illustrated in FIG. 5 (a).

More specifically, the wiring mother substrate 300 is placed in a molding device, which is not shown in the drawings, and in a state in which the wiring mother substrate 300 is clamped between an upper die and a lower die of the molding device, the mold is filled with molten sealing resin, for example a thermosetting resin such as an epoxy resin, which is cured in the filled state.

The sealing resin is thus thermally cured to form the sealing body 220 covering collectively the product-forming portions 301, as illustrated in FIG. 5 (a).

The wiring mother substrate 300 is then removed from the molding device and is subjected to reflow at a certain temperature, thereby completely curing the sealing body 220.

Next, as illustrated in FIG. 5 (b), the solder balls 216 are installed on each of the land portions 225 on the other surface side of the wiring mother substrate 300.

More specifically, using a suction-attachment mechanism, which is not shown in the drawings, in which a plurality of suction-attachment holes are formed matching the arrangement of the land portions 225 on the wiring mother substrate 300, for example, the solder balls 216 are held in the suction-attachment holes, and the held solder balls 216 are installed collectively on the land portions 225 of the wiring mother substrate 300, with the interposition of flux.

After the solder balls 216 have been installed on all of the product-forming portions 301, the solder balls 216 are secured by subjecting the wiring mother substrate 300 to reflow.

Next, as illustrated in FIG. 5 (c), the sealing body 220 is caused to adhere to a dicing tape 251, and the sealing body 220 and the wiring mother substrate 300 are supported by the dicing tape 251. Then using a dicing blade, which is not shown in the drawings, the wiring mother substrate 300 and the sealing body 220 are cut lengthwise and crosswise along dicing lines 234 (see FIG. 4 (a)). By this means the wiring mother substrate 300 is diced into individual product-forming portions 301. The diced product-forming portions 301 and sealing bodies 220 are then picked up from the dicing tape 251 to yield the semiconductor devices 200 such as those illustrated in FIG. 1.

Thus, according to the first mode of embodiment, the semiconductor device 200 comprises: the wiring substrate 201; the first semiconductor chip 203 installed on one surface of the wiring substrate 201; the second semiconductor chip 205 stacked on the first semiconductor chip 203 in such a way that portions of the surface of the first semiconductor chip 203 are exposed to form the exposed surfaces 210a and 210b; the silicon substrates 211a and 211b, installed on the exposed surfaces 210a and 210b; and the sealing body 220 formed on the wiring substrate 201 in such a way as to cover the first semiconductor chip 203, the second semiconductor chip 205 and the silicon substrates 211a and 211b.

Thus the thickness of the sealing body 220 formed on the exposed surfaces 210a and 210b of the first semiconductor chip 203, exposed away from the second semiconductor chip 205, can be made to be the same as or close to the thickness of the sealing body 220 formed on the second semiconductor chip 205.

In this way, warping of the first semiconductor chip 203 along the short edges 212a and 212b can be suppressed, and warping of the semiconductor device 200 can be reduced. Further, by reducing warping of the semiconductor device 200, secondary mounting of the semiconductor device 200 onto a mother board or a lower package can be performed satisfactorily.

A second mode of embodiment will now be described with reference to FIG. 6 to FIG. 8.

In the second mode of embodiment, the second semiconductor chip 205 in the first mode of embodiment is installed shifted in such a way as to be adjacent to one set of the electrode pads 103a or 103b on the first semiconductor chip 203.

It should be noted that in the second mode of embodiment, the same numbers denote elements that fulfill the same function as in the first embodiment, and the description will mainly relate to parts that differ from the first mode of embodiment.

Figure 6:
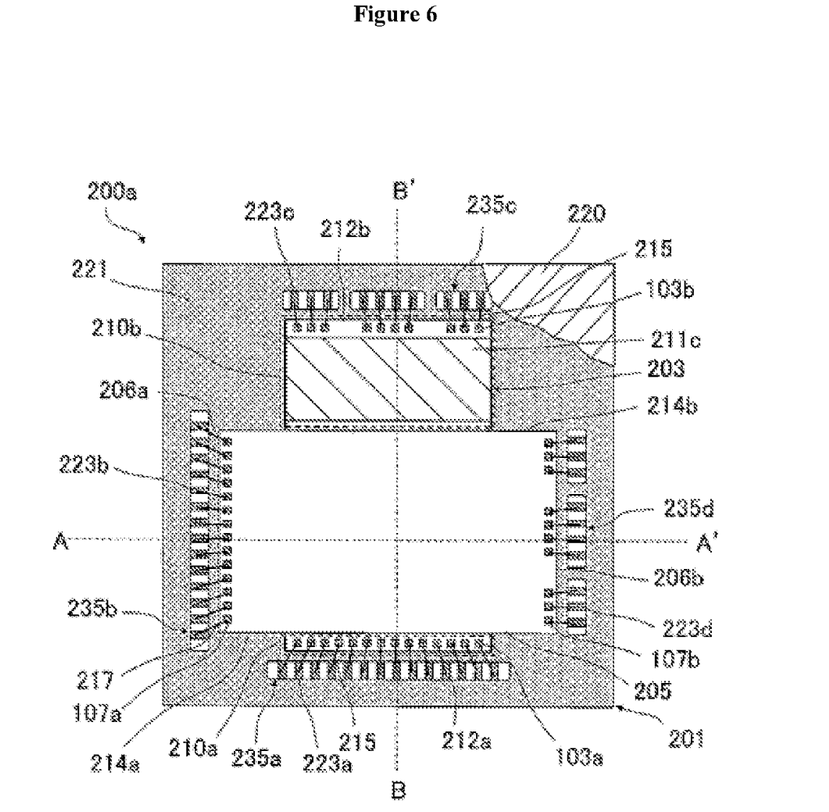
FIG. 6 is plan view illustrating a semiconductor device 200a according to a second mode of embodiment, in which only a portion of the sealing body 220 is depicted.
Figure 7:
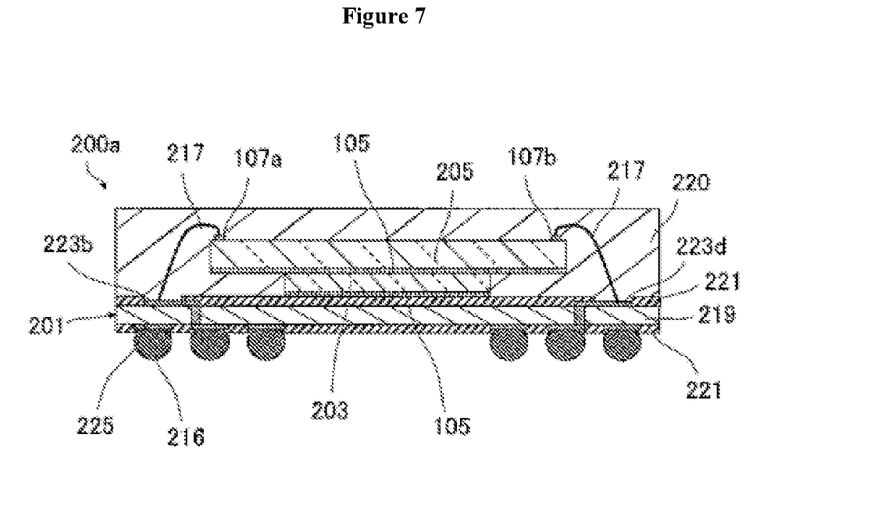
FIG. 7 is a cross-sectional view through A-A' in FIG. 6.
Figure 8:
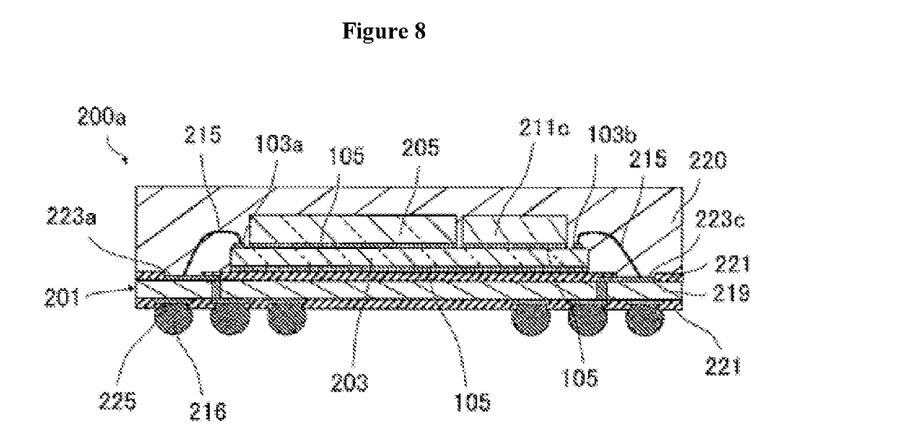
FIG. 8 is a cross-sectional view through B-B' in FIG. 6.

As illustrated in FIG. 6 to FIG. 8, in a semiconductor device 200a according to the second mode of embodiment, the second semiconductor chip 205 is installed shifted in such a way as to be adjacent to one set of the electrode pads 103a or 103b (here, the side closest to the electrode pads 103a) on the first semiconductor chip 203.

The surface areas of the exposed surface 210a and the exposed surface 210b thus differ significantly, the surface area of the exposed surface 210a being the minimum surface area required to expose the electrode pads 103a.

Therefore one silicon substrate 211c is installed, on only the exposed surface 210b.

Thus warp regulating members do not necessarily need to be disposed on both exposed surfaces 210a and 210b, and depending on the surface areas of the exposed surfaces 210a and 210b, the silicon substrate 211c may be installed on only one exposed surface.

This makes it possible for the number of silicon substrates 211c installed to be reduced compared with the first mode of embodiment.

Thus, according to the second mode of embodiment, the semiconductor device 200a comprises: the wiring substrate 201; the first semiconductor chip 203 installed on one surface of the wiring substrate 201; the second semiconductor chip 205 stacked on the first semiconductor chip 203 in such a way that portions of the surface of the first semiconductor chip 203 are exposed to form the exposed surfaces 210a and 210b; the silicon substrate 211c, installed on the exposed surface 210b; and the sealing body 220 formed on the wiring substrate 201 in such a way as to cover the first semiconductor chip 203, the second semiconductor chip 205 and the silicon substrate 211c.

This mode of embodiment therefore exhibits the same advantages as the first mode of embodiment.

Further, according to the second mode of embodiment, the second semiconductor chip 205 is installed shifted in such a way as to be adjacent to the electrode pads 103a on the first semiconductor chip 203, and one silicon substrate 211c is installed, on only the exposed surface 210b.

This makes it possible for the number of silicon substrates 211c installed to be reduced compared with the first mode of embodiment.

A third mode of embodiment will now be described with reference to FIG. 9 to FIG. 13.

Figure 9:
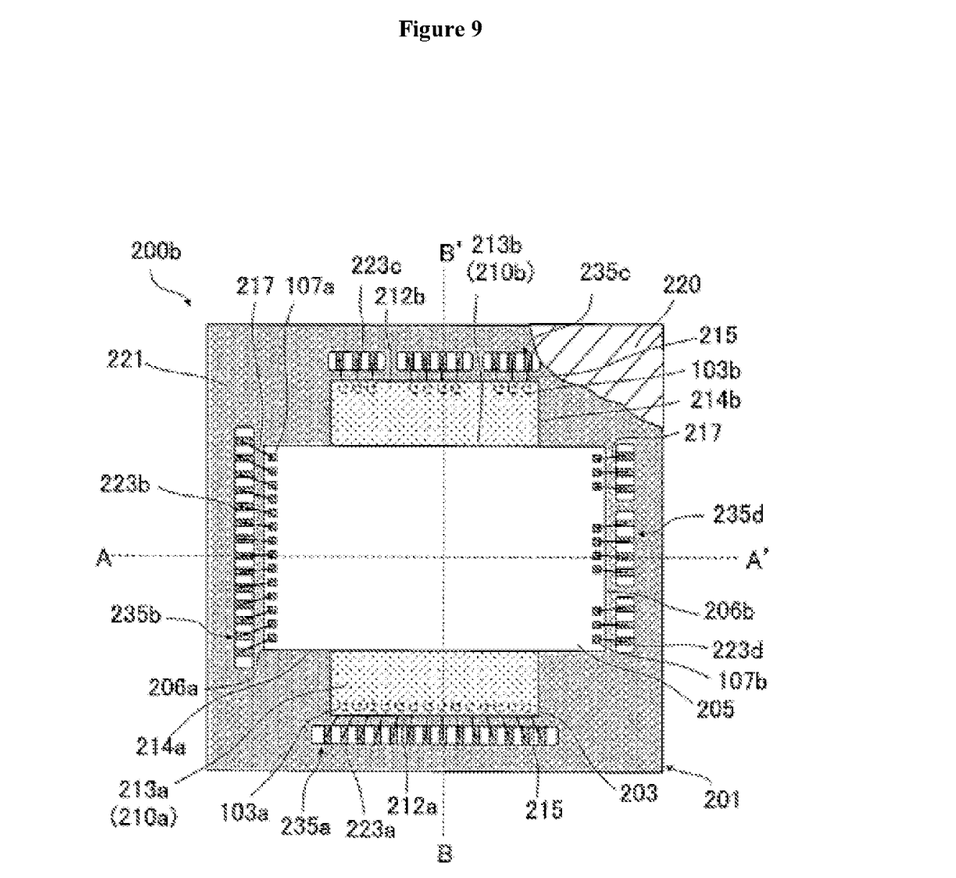
FIG. 9 is plan view illustrating a semiconductor device 200b according to a third mode of embodiment, in which only a portion of the sealing body 220 is depicted.

In the third mode of embodiment, highly-resilient bodies 213a and 213b are used as the warp regulating members in the first mode of embodiment.

It should be noted that in the third embodiment, the same numbers denote elements that fulfill the same function as in the first embodiment, and the description will mainly relate to parts that differ from the first embodiment.

The configuration of a semiconductor device 200b according to the third mode of embodiment will first be described.

Figure 10:
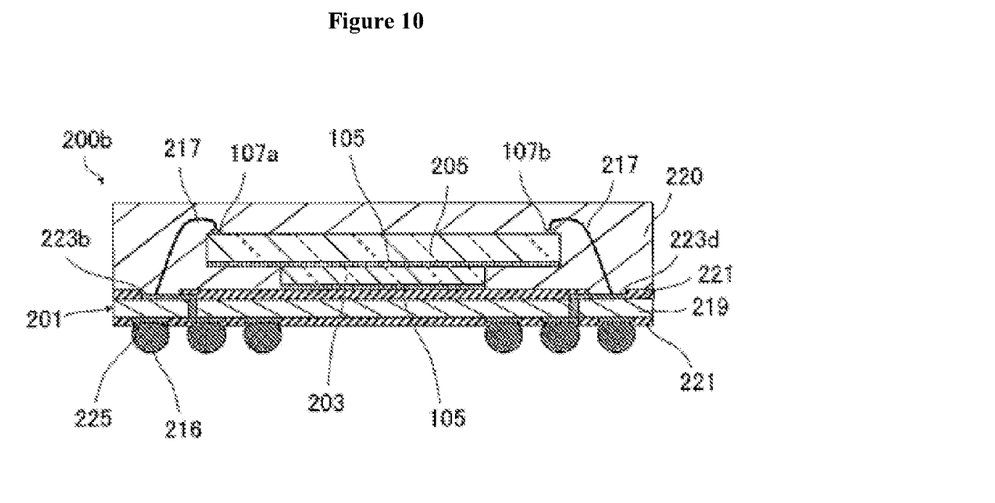
FIG. 10 is a cross-sectional view through A-A' in FIG. 9.
Figure 11:
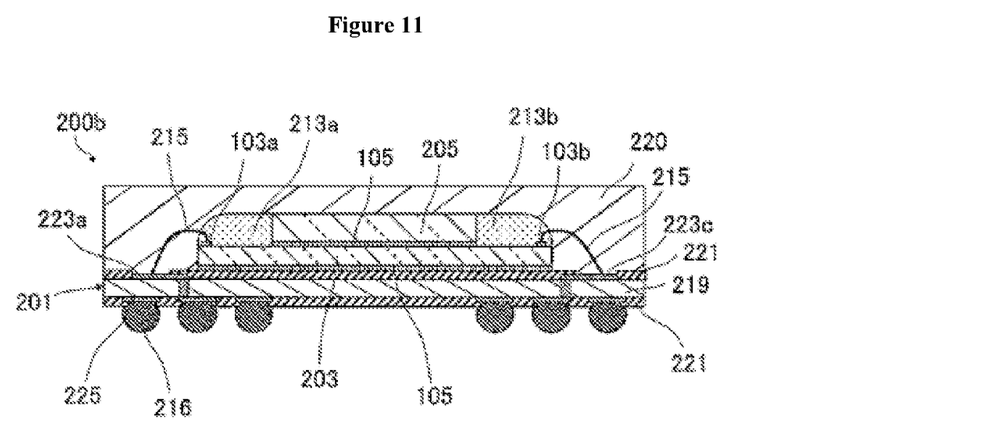
FIG. 11 is a cross-sectional view through B-B' in FIG. 9.

As illustrated in FIG. 9 to FIG. 11, in the semiconductor device 200b according to the third mode of embodiment, the highly-resilient bodies 213a and 213b are provided as the warp regulating members on the exposed surfaces 210a and 210b.

A resin material having a modulus of elasticity higher than that of the sealing body 220, specifically an insulating paste material or the like, is, for example, employed as the material used to form the highly-resilient bodies 213a and 213b.

Further, the highly-resilient bodies 213a and 213b cover the electrode pads 103a and 103b and the portions of the wires 215 connected to the electrode pads 103a and 103b.

Thus the warp regulating members do not necessarily need to be bulk materials such as silicon substrates, and resin or the like may also be employed.

By adopting such a configuration, it is possible for the highly-resilient bodies 213a and 213b to cover the electrode pads 103a and 103b and the portions of the wires 215 connected to the electrode pads 103a and 103b, and it is therefore possible to suppress wire sweep and wire short circuiting of the wires 215. It should be noted that the highly-resilient bodies 213a and 213b are preferably formed with substantially the same thickness as the second semiconductor chip 205, in the same way as with the silicon substrates 211a, 211b and 211c.

Figure 12:
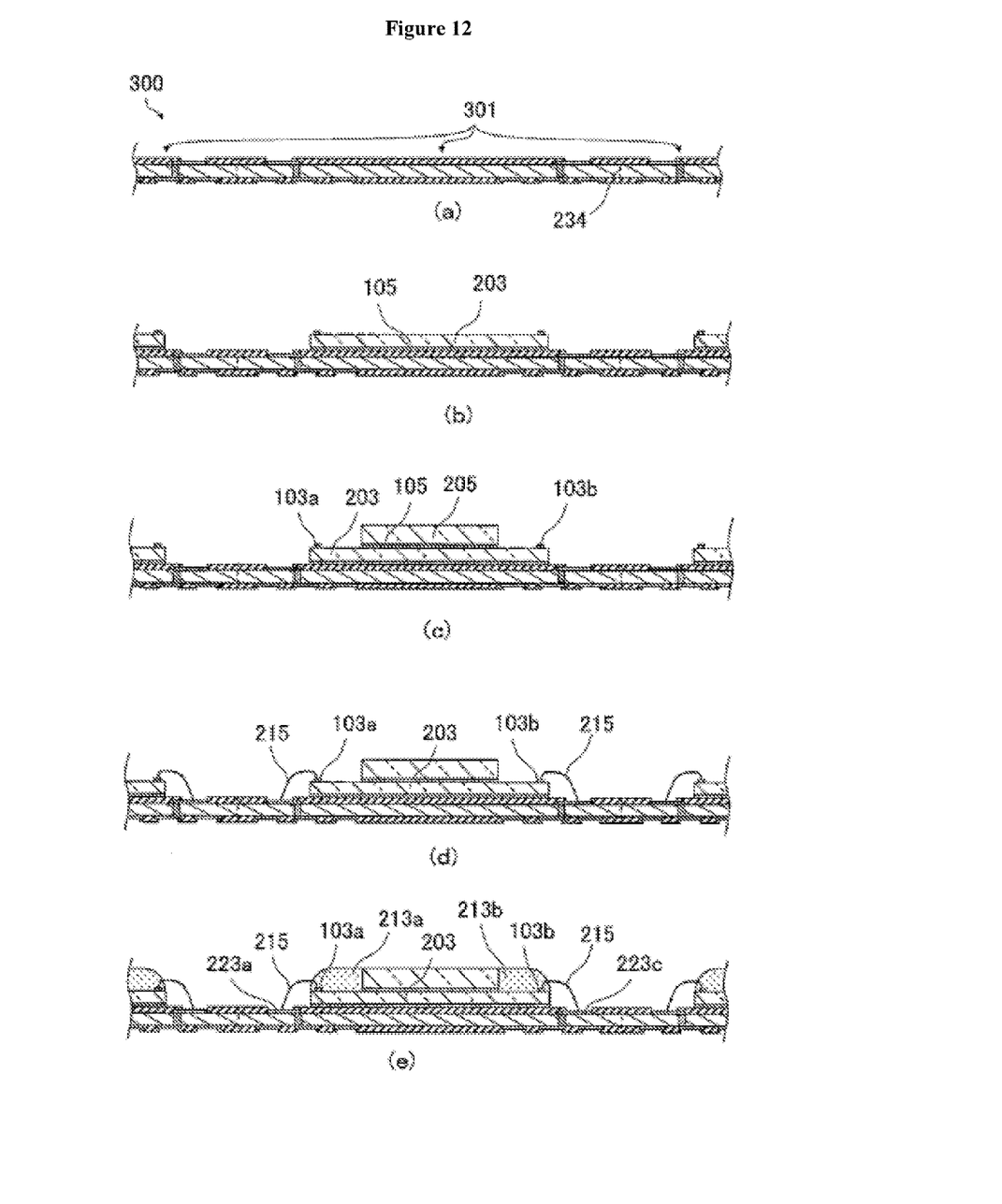
FIG. 12 is a drawing illustrating a procedure for manufacturing the semiconductor device 200b.
Figure 13:
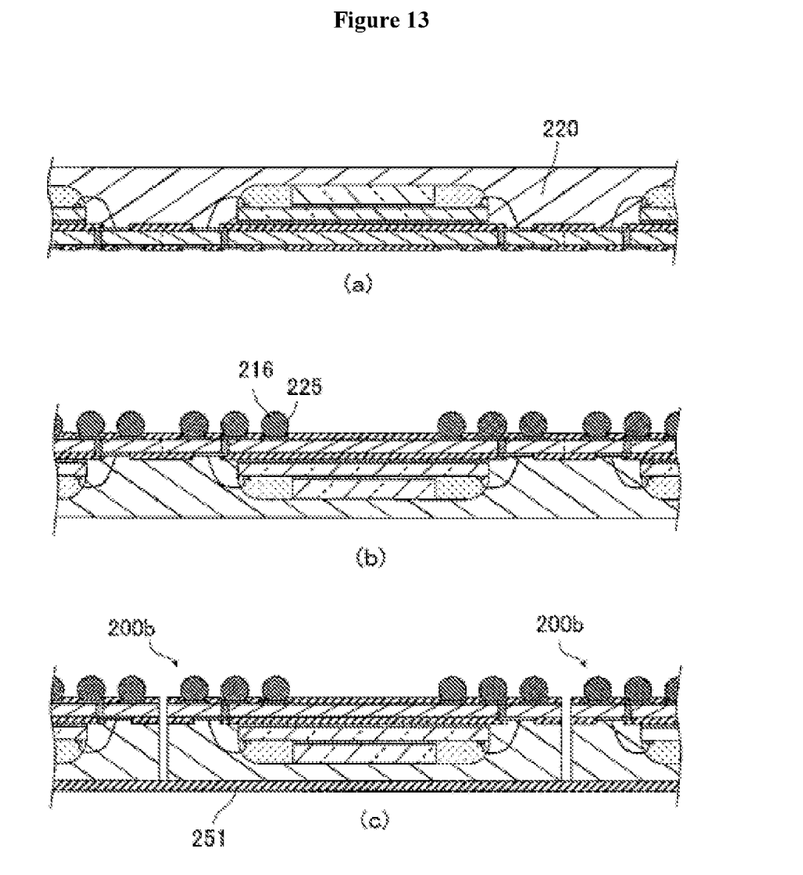
FIG. 13 is a drawing illustrating a procedure for manufacturing the semiconductor device 200b.

A method of manufacturing the semiconductor device 200b will now be described briefly.

First, in the same way as in the first mode of embodiment, the wiring mother substrate 300 illustrated in FIG. 12 (a) is prepared, then as illustrated in FIG. 12 (b) the wiring mother substrate 300 is conveyed to a die bonding device, which is not shown in the drawings, and the first semiconductor chips 203 are installed on the product-forming portions 301 of the wiring mother substrate 300 using the die bonding device, after which, as illustrated in FIG. 12 (c), the second semiconductor chips 205 are installed on the first semiconductor chips 203.

Next, as illustrated in FIG. 12 (d), wire bonding is employed to connect the first semiconductor chips 203 and the second semiconductor chips 205 to the wiring substrates 201 using the wires 215 and 217.

Next, as illustrated in FIG. 12 (e), the highly-resilient bodies 213a and 213b are formed on the exposed surfaces 210a and 210b.

More specifically, an insulating paste material is supplied onto the exposed surfaces 210a and 210b using a dispenser, which is not shown in the drawings, for example.

At this time, the highly-resilient bodies 213a and 213b preferably cover the electrode pads 103a and 103b and the portions of the wires 215 connected to the electrode pads 103a and 103b.

In the same way as in the first mode of embodiment, the semiconductor device 200b is obtained by subsequently forming the sealing body 220 illustrated in FIG. 13 (a), installing the solder balls 216 illustrated in FIG. 13 (b), and cutting (dicing) the wiring mother substrate 300 as illustrated in FIG. 13 (c).

Thus, according to the third mode of embodiment, the semiconductor device 200b comprises: the wiring substrate 201; the first semiconductor chip 203 installed on one surface of the wiring substrate 201; the second semiconductor chip 205 stacked on the first semiconductor chip 203 in such a way that portions of the surface of the first semiconductor chip 203 are exposed to form the exposed surfaces 210a and 210b; the highly-resilient bodies 213a and 213b, installed on the exposed surfaces 210a and 210b; and the sealing body 220 formed on the wiring substrate 201 in such a way as to cover the first semiconductor chip 203, the second semiconductor chip 205 and the highly-resilient bodies 213a and 213b. This mode of embodiment therefore exhibits the same advantages as the first mode of embodiment.

Further, according to the third mode of embodiment, the highly-resilient bodies 213a and 213b are provided as the warp regulating members, and the highly-resilient bodies 213a and 213b cover the electrode pads 103a and 103b and the portions of the wires 215 connected to the electrode pads 103a and 103b.

Thus in comparison with the first mode of embodiment, wire sweep and wire short circuiting of the wires 215 can also be suppressed.

INDUSTRIAL APPLICABILITY

The invention devised by the inventors has been described hereinabove with reference to modes of embodiment, but the present invention is not restricted to the abovementioned modes of embodiment, and it goes without saying that various modifications are possible without deviating from the gist of the invention.

For example, in the modes of embodiment described hereinabove, memory chips are illustrated as the semiconductor chips, by way of example, but any combination of semiconductor chips may be employed, for example logic chips and memory chips.

Further, in the modes of embodiment described hereinabove, a description is given of cases in which semiconductor chips are stacked on two levels, but the present invention is also applicable in the same way to semiconductor devices in which semiconductor chips are stacked on three or more levels, by disposing the warp regulating members on the semiconductor chip adjacent to and exposed away from the uppermost semiconductor chip.

This application is based upon and claims the benefit of priority from Japanese Patent Application No. 2013-63818, filed on Mar. 26, 2013, the entire disclosure of which is incorporated herein by reference.

EXPLANATION OF THE REFERENCE CODES 130a, 103b: Electrode pad
105: Adhesive member
107a, 107b: Electrode pad
200: Semiconductor device
200a: Semiconductor device
200b: Semiconductor device
201: Wiring substrate
203: First semiconductor chip
205: Second semiconductor chip
206a, 206b: Short edge
210a, 210b: Exposed surface
211a, 211b, 211c: Silicon substrate
212a, 212b: Short edge
213a, 213b: Resilient body
214a, 214b: Long edge
215: Wire
216: Solder ball
217: Wire
219: Insulating substrate
220: Sealing body
221: Insulating film
223a, 223b, 223c, 223d: Connection pad
225: Land portion
234: Dicing line
235a, 235b, 235c, 235d: Opening portion
251: Dicing tape
300: Wiring mother substrate
301: Product-forming portion

What is claimed is:

1. A semiconductor device comprising:
   a wiring substrate;
   a first semiconductor chip installed on one surface of the wiring substrate, the first semiconductor chip having a first edge and a second edge opposite to the first edge;
   a second semiconductor chip stacked on the first semiconductor chip so that the second semiconductor chip crosses over the first edge and the second edge of the first semiconductor chip and a portion of a surface of the first semiconductor chip is exposed, wherein the second semiconductor chip is the top most semiconductor chip in the package:
   a warp regulating member disposed directly on the exposed portion of the surface, wherein the warp regulating member comprises a first edge that aligns with the first edge of the first semiconductor chip and a second edge that aligns with the second edge of the first semiconductor chip and the warp regulating member covers a majority of the exposed portion of the surface: and
   a sealing body formed on the wiring substrate to cover the first semiconductor chip, the second semiconductor chip, and the warp regulating member;
   wherein the warp regulating member is a highly-resilient body having a modulus of elasticity higher than that of the sealing body.

2. The semiconductor device as claimed in claim 1, wherein the warp regulating member is a silicon substrate.

3. The semiconductor device as claimed in claim 1, wherein the first and second semiconductor chips have a rectangular planar shape and have a long edge and a short edge, and the second semiconductor chip is stacked on the first semiconductor chip so that the long edge of the second semiconductor chip faces the short edge of the first semiconductor chip.

4. The semiconductor device as claimed in claim 1, further comprising external terminals disposed on another surface of the wiring substrate and electrically connected to the first semiconductor chip.

5. The semiconductor device as claimed in claim 1, wherein the thickness of the warp regulating member is substantially the same as the thickness of the second semiconductor chip.

6. The semiconductor device as claimed in claim 3, wherein the second semiconductor chip is cross-stacked in a state rotated relative to the first semiconductor chip so that the planar arrangements of the first semiconductor chip and the second semiconductor chip intersect.

7. The semiconductor device as claimed in claim 3, wherein the first semiconductor chip has electrode pads disposed along the short edge and electrically connected to the wiring substrate, and the second semiconductor chip is disposed adjacent to the electrode pads.

8. The semiconductor device as claimed in claim 3, wherein the thickness of the second semiconductor chip is greater than the thickness of the first semiconductor chip.

9. The semiconductor device as claimed in claim 4, wherein the external terminals are solder balls.

10. The semiconductor device as claimed in claim 7, further comprising wires electrically connecting the electrode pads to the wiring substrate, wherein the warp regulating member is disposed to cover the electrode pads.

* * * * *